United States Patent [19]

Voles

[11] Patent Number: 5,036,197
[45] Date of Patent: Jul. 30, 1991

[54] THERMAL IMAGING DEVICE

[75] Inventor: Roger Voles, London, England

[73] Assignee: Thorn EMI Electronics Limited, Hayes, England

[21] Appl. No.: 446,534

[22] Filed: Dec. 6, 1989

[30] Foreign Application Priority Data

Dec. 13, 1988 [GB] United Kingdom ............... 8829035

[51] Int. Cl.[5] ............................................. G01J 5/20
[52] U.S. Cl. .................................. 250/332; 250/330; 250/338.3
[58] Field of Search ............... 250/330, 331, 332, 333, 250/334, 338.3; 358/113

[56] References Cited

U.S. PATENT DOCUMENTS

| 3,401,262 | 9/1968 | Fergason | 250/332 |
| 4,323,776 | 4/1982 | Bridges et al. | 250/332 |
| 4,722,612 | 2/1988 | Junkert et al. | 250/339 |
| 4,861,996 | 8/1989 | Roth et al. | 250/330 |
| 4,894,544 | 1/1990 | Turnbull | 250/338.3 |
| 4,931,648 | 6/1990 | Elliot et al. | 250/370.10 |

OTHER PUBLICATIONS

Higham & Wilkinson, Thermal Imager Using Ceramic Pyroelectric Detectors, Plessey Radar Research Center 1975.

Primary Examiner—Carolyn E. Fields
Assistant Examiner—James E. Beyer
Attorney, Agent, or Firm—Fleit, Jacobson, Cohn, Price, Holman & Stern

[57] ABSTRACT

A thermal imaging device includes an array of pyroelectric infra-red detector pixels. An array of pillars carries electrical signals between each detector pixel and a respective signal processing circuit formed on a semiconducting substrate. Each circuit is connected to an individual display device carried by the substrate.

9 Claims, 5 Drawing Sheets

THERMAL IMAGING DEVICE

This invention relates to thermal imaging devices and in particular to thermal imaging devices comprising an array of pyroelectric detector elements responsive to infra-red radiation.

In our co-pending European Patent Application No. 89305496 there is disclosed a thermal imaging device as shown in FIG. 1 of the accompanying figures, FIG. 1(A) showing a plan view of part of a surface of the device, and FIG. 1(B) showing a section along the line A—A of the device. The device thus includes a thin pyroelectric film 1, an array of interconnected electrodes 2 being formed on one side of the film covered with an infra-red absorbent layer 10. An array of discrete electrodes 3 is formed on the other side of the film 1, an array of electrically conductive patches 4 being formed in the gaps between the discrete electrodes 3. Each patch 4 is connected to a respective discrete electrode by a long, narrow electrical conductor 5. Each patch 4 is also electrically connected via a respective pillar 6 to a respective input 7 of a processing circuit 8 containing a pixel amplifier and formed on a substrate 9, the pillars 6 also serving to support the film 1. Other arrangements of electrodes on a pyroelectric layer and of supportive pillars have also been proposed.

Such devices suffer the disadvantage that, if the detector array has a large number of pixels (e.g. $10^4$–$10^5$), multiplexing the outputs from the pixel amplifiers before feeding them to a separate display unit would be costly and would significantly increase the size of the imaging device.

It is an object of the present invention to alleviate the aforementioned disadvantages.

The present invention provides a thermal imaging device comprising an array of pyroelectric detector elements, means effective to transfer electrical signals between each detector element and a respective circuit means, and an array of display pixels, each display pixel being connected to the output of a respective circuit means.

A thermal imaging device in accordance with the present invention thus has the advantage of eliminating the need for multiplexing and demultiplexing devices required in prior art thermal imaging devices, and of providing a compact construction.

The pyroelectric material in the device may comprise material which is inherently pyroelectric, or material whose pyroelectric characteristics are induced (e.g. by appropriate poling of a ferroelectric material).

In the preferred embodiment, the circuit means are formed on a semiconducting substrate and the display pixels are mounted on one surface of said semiconducting substrate.

The display pixels may comprise light emitting diodes (LEDs). The circuit means suitably comprises integrated amplifiers. The means for transferring electrical signals may comprise an array of pillars which are either electrically insulative with elongate electrically conductive strips along their length or electrically conductive, the pillars also supporting the array of pyroelectric detector elements.

Embodiments of the invention will now be described in greater detail, by way of example only, with reference to the accompanying figures of which:

Figure 1A:
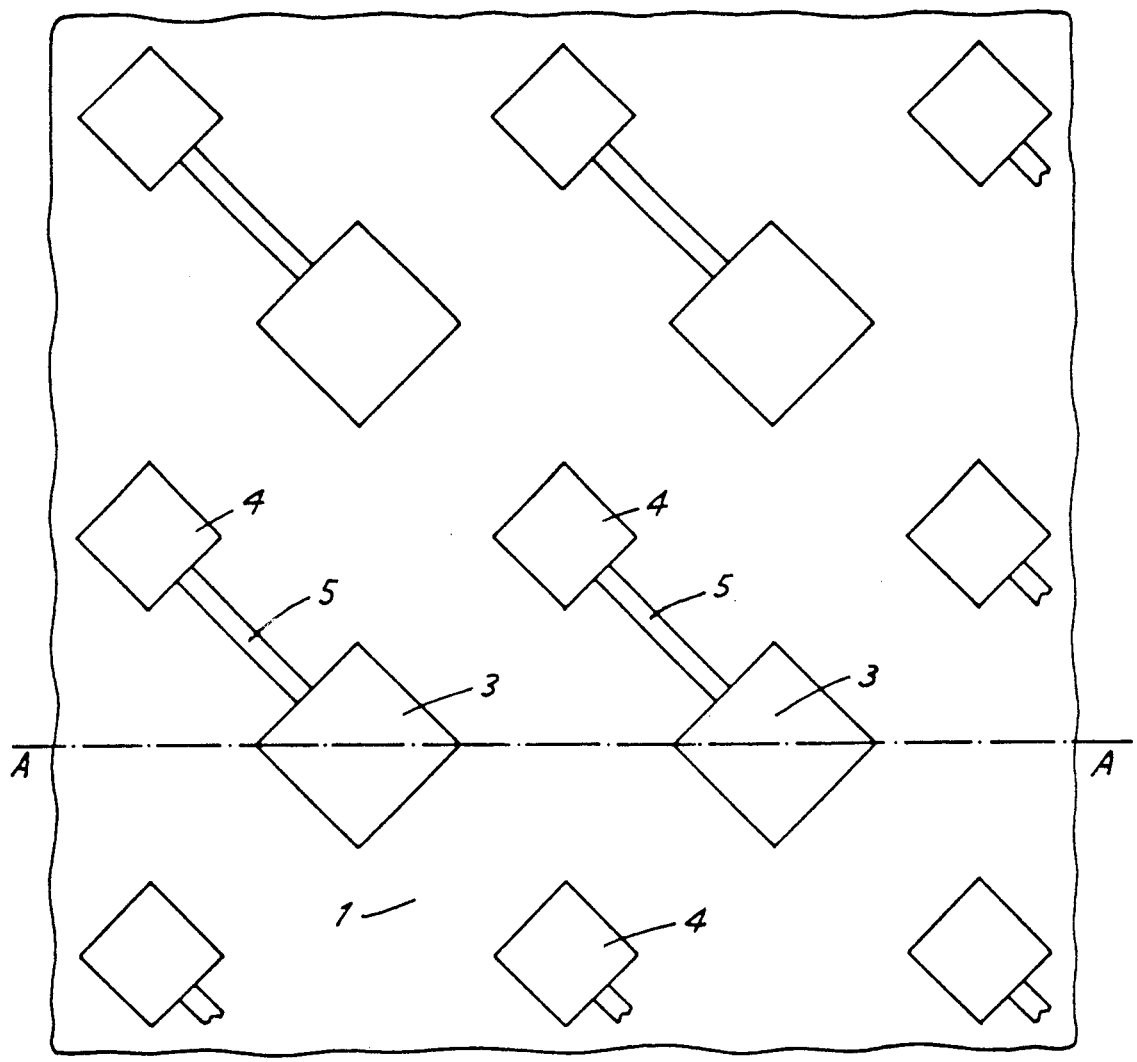
FIG. 1A and 1B show the prior art arrangement already described.
Figure 1B:
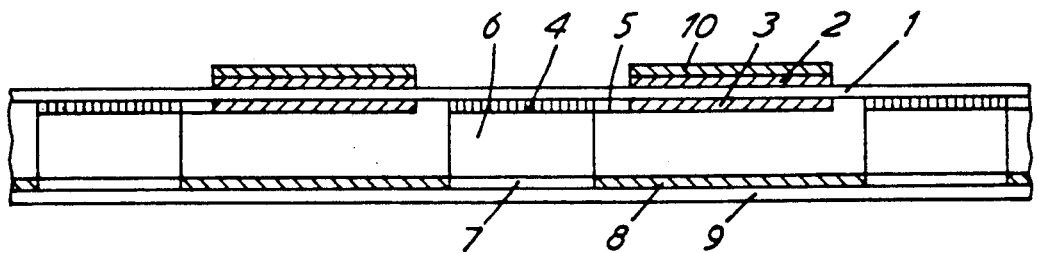
Figure 2A:
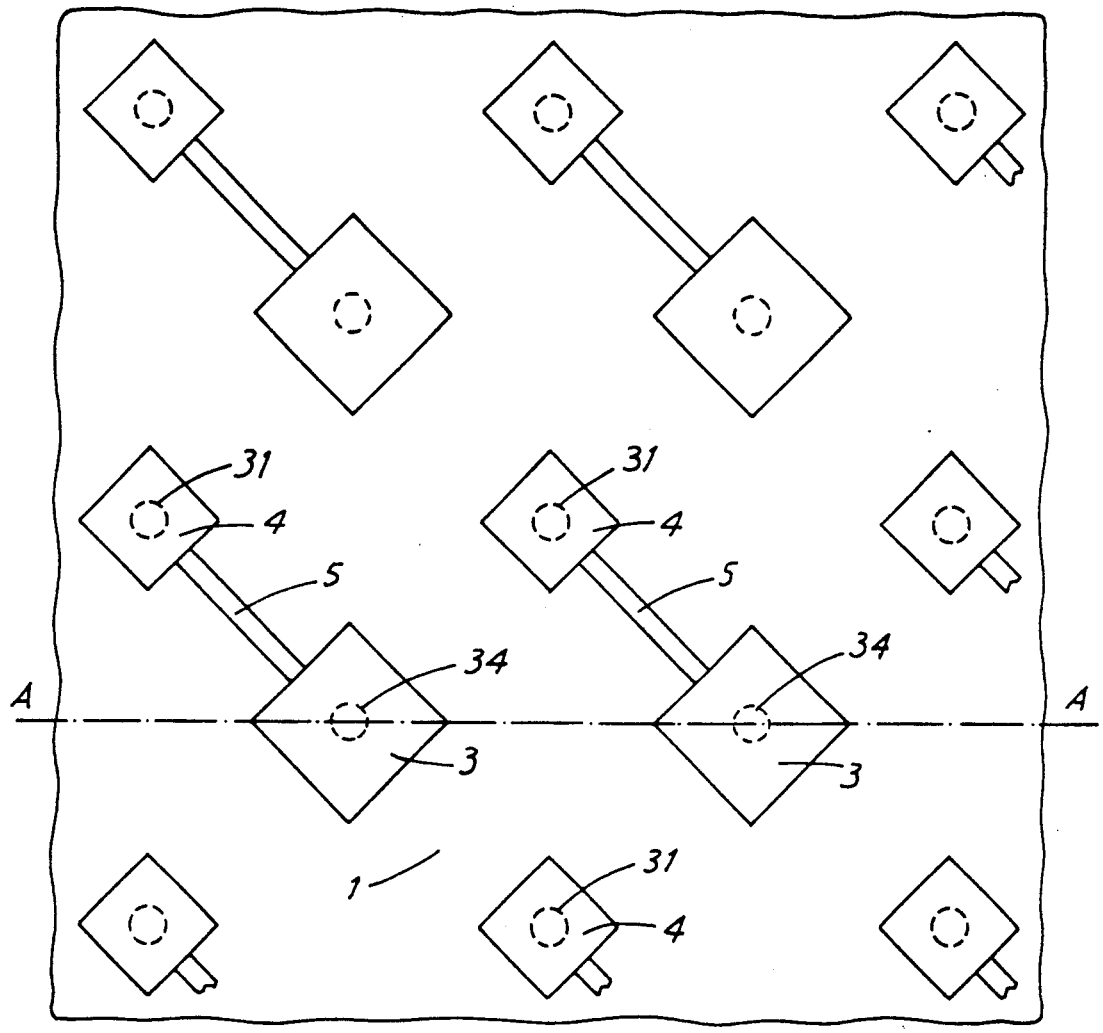
FIG. 2A is a plan view of part of a surface of a detector array incorporated in a thermal imaging in accordance with the invention.
Figure 2B:
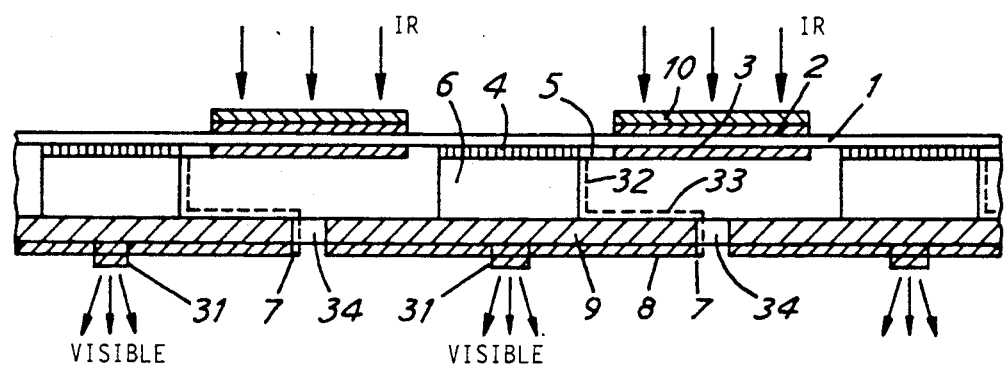
FIG. 2B is a section along the line A—A in FIG. 2A.

Referring firstly to FIGS. 2A and 2B in which like components to those shown in the prior art device of FIG. 1 are correspondingly labelled, the detector array of the thermal imaging device in accordance with the invention includes a thin pyroelectric film 1, of, for example polyvinyledene fluoride. An array of interconnected electrodes 2 is formed on one side of the film, an array of discrete electrodes 3 being formed on the other side of the film. The interconnected electrodes 2, film 1 and discrete electrodes 3 thus define an array of infra-red detector pixels. An array of electrically conductive patches 4 is formed in the gaps between the discrete electrodes, each patch being connected to a respective discrete electrode by a long, narrow electrical conductor 5. Each patch 4 is also electrically connected via a respective pillar 6 to a respective input 7 of an integrated processing circuit 8 formed on a silicon substrate 9, the pillars 6 also serving to support the film. The array of interconnected electrodes 2 carries an infra-red absorbent layer 10.

As thus far described the arrangement is generally as in the prior art arrangement shown in FIGS. 1A and 1B. The arrangement of FIGS. 2A and 2B however differs from that shown in FIGS. 1A and 1B in that the integrated circuit 8 is arranged on the face of the substrate 9 remote from the film 1. The conductive patch 4 is connected to the input of a respective integrated circuit 8 via a thin, narrow conductor 32 running along the length of the respective insulative pillar 6, and via a further thin, narrow conductor 33 extending along the surface of the substrate 9 adjacent to the film 1, through a hole 34 in the substrate 9, to terminate at the input 7 of a respective integrated circuit 8. Each circuit 8 is arranged to support and energise a respective light emitting diode (LED) 31.

Figure 3:
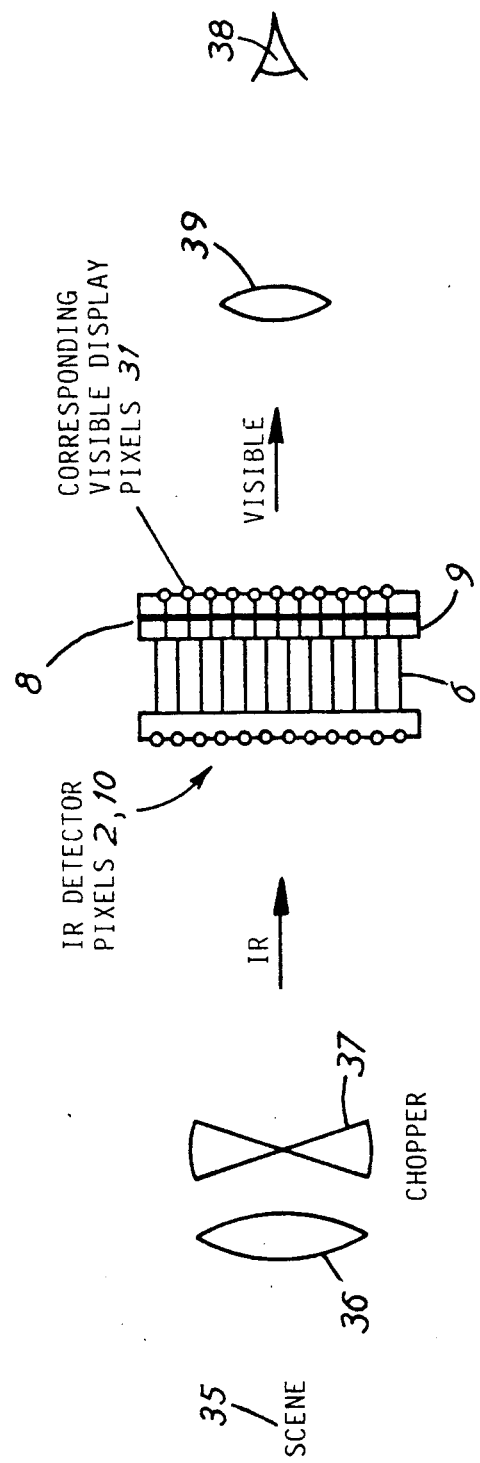
FIG. 3 is an overall schematic view of the thermal imaging device incorporating the array of FIG. 2A and 2B.

Referring now also to FIG. 3, in use of the device, an infra-red (IR) image of a scene 35 is focussed by a lens 36 onto the surface of the detector array carrying the interconnected electrodes 2 and the overlying infra-red absorbent layer 10. The IR radiation is interrupted at regular intervals by a chopper 37. A visual representation of the scene 35 is created in pixels by the LEDs 31, the representation being viewable by an observer's eye 38 via lens 39. It will be appreciated that by arranging for each detector array pixel, 2, 1, 3 to be connected via a respective integrated circuit 8 to a respective display pixel 31, the use of multiplexing and demultiplexing devices is avoided, thus simplifying construction of the device and saving space.

Figure 4A:
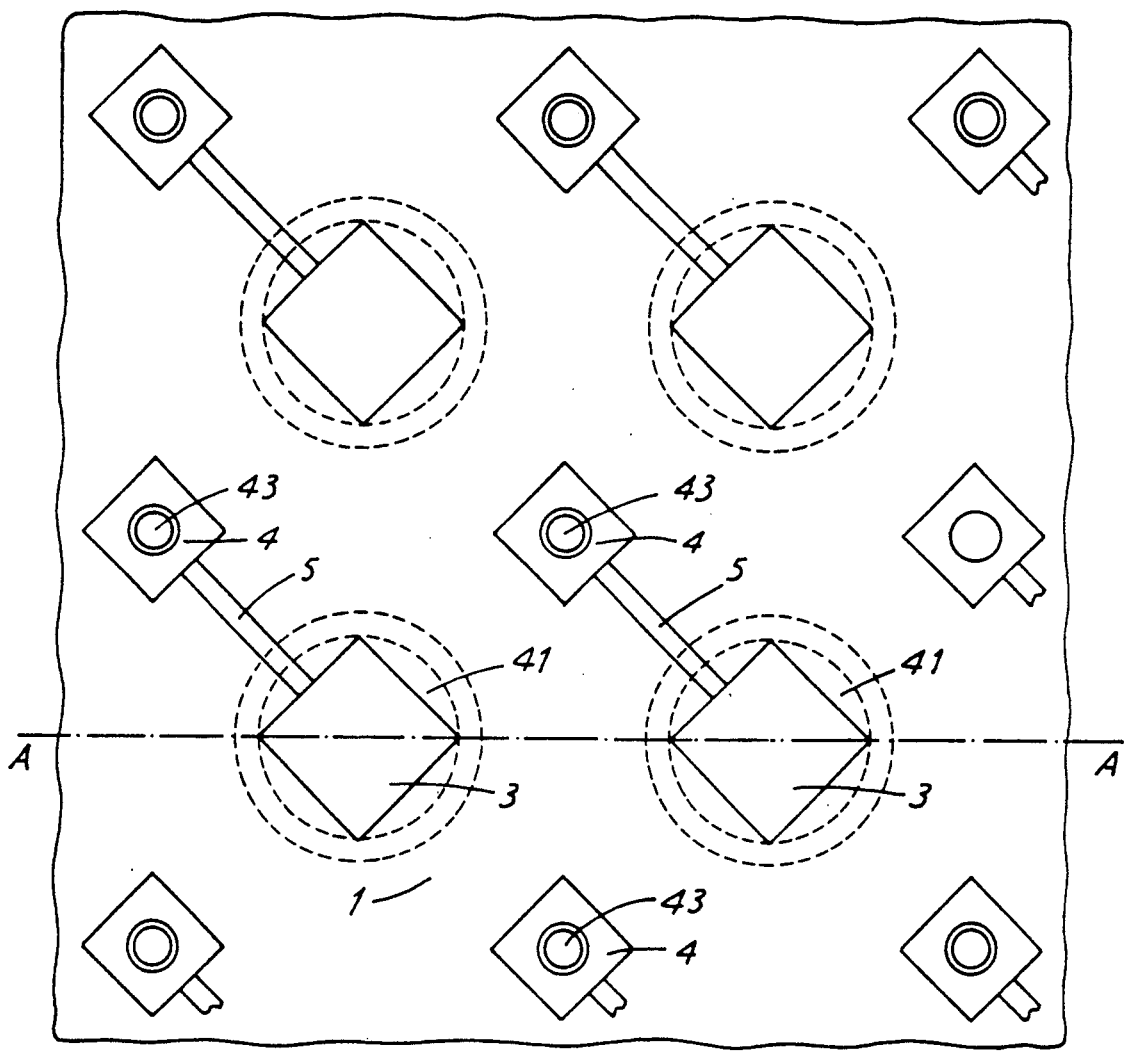
FIG. 4A is a plan view of part of a surface of an alternative detector array incorporated in the device of FIG. 3.

Referring now to FIGS. 4(A) and (B), the device shown in these figures is a modification of the device shown in FIG. 2, and thus corresponding features are correspondingly labelled. The device of FIGS. 4(A) and (B) varies from the device of FIG. 2 in that it is designed to receive IR radiation from the substrate 9 side of the device. Accordingly the infra-red absorbent layer 10 is formed on the discrete electrodes 3, rather than on the interconnected electrodes 1 as before. The IR radiation passes through holes 41 in the substrate 8 and on to infra-red absorbent laYers 10 formed on the discrete electrodes 3. The pillars 6 are hollow. Each patch 4 is connected to an input 7 of a respective processing circuit 8 on the inner surface of the substrate 9 via a thin narrow conductor 42 running along the length of the pillar 6. The output of each processing circuit 8 is connected to an LED 43 on the inner surface of the substrate 9 and inside the hollow pillar 6. Light from each LED shines through the pyroelectric film 1 or (if necessary) through a small hole in the pyroelectric film.

Figure 4B:
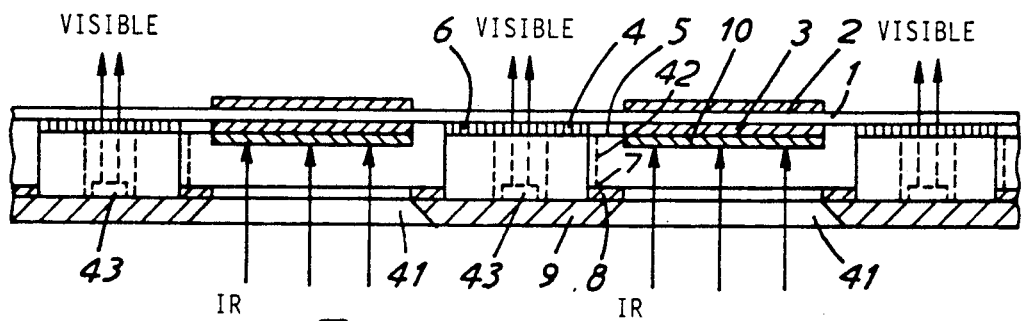
FIG. 4B is a section along the line AA in FIG. 4A.

If the substrate 9 comprises a material transparent to infra-red, such as gallium arsenide, the holes 41 in FIG. 4 are not necessary, although the areas of the substrate corresponding to the holes 41 must be kept free from any processing circuits or other possible obstructions to the IR input radiation 1. In this arrangement the external surface of the substrate 41 is continuous, without holes or deposited materials. It would therefore be possible to mount on this surface an electrically controlled IR shutter to replace the mechanical chopper 24 in FIG. 2.

Figure 5:
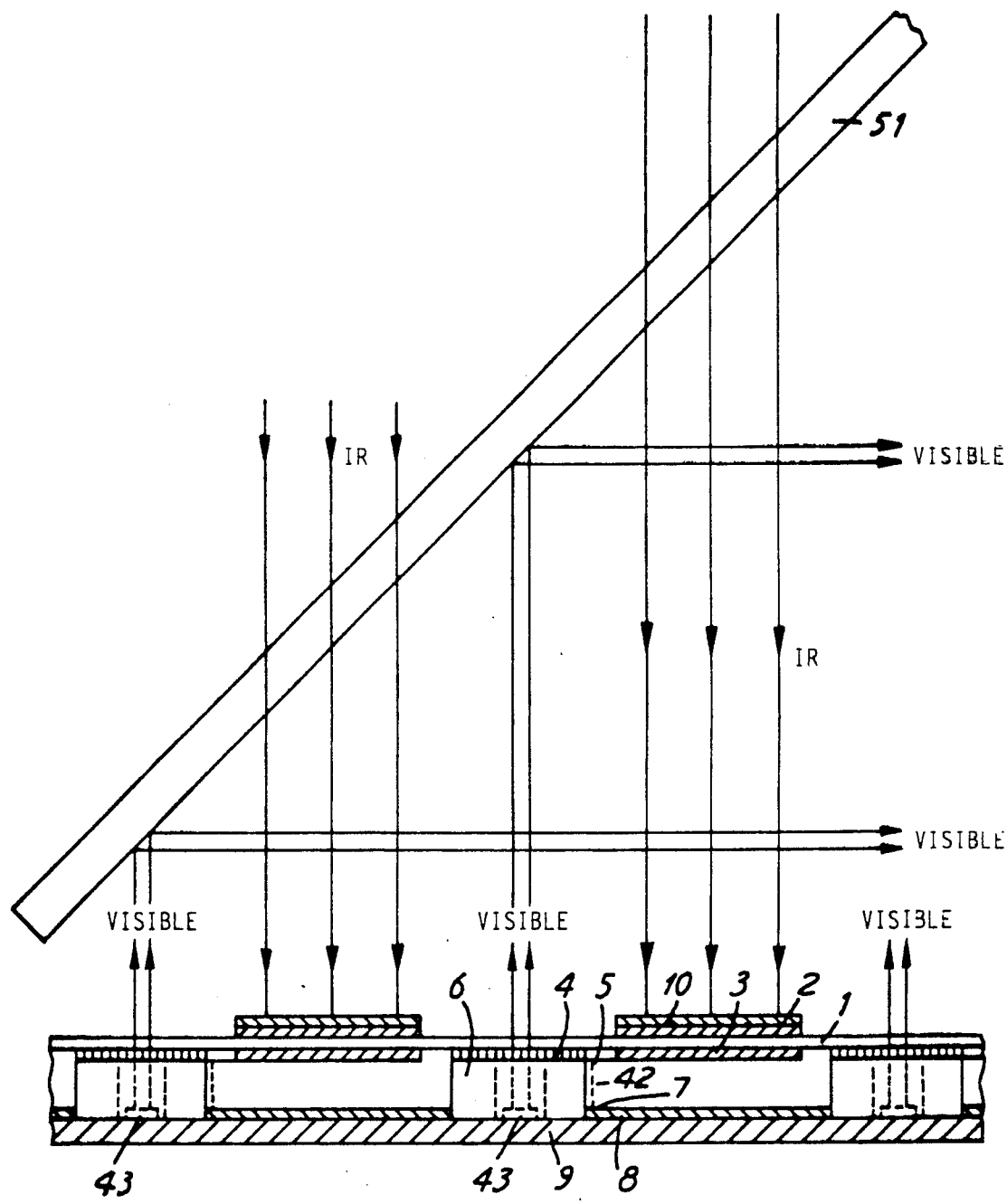
FIG. 5 is a sectional view of a modification of part of the device of FIG. 3.

The arrangement shown in FIG. 5 eliminates the need for the substrate holes 41 shown in FIG. 4, the infra-red radiation being received on the outer face of the pyroelectric film from which the visible radiation emerges. A dichroic mirror 51 transmits the incoming infra-red radiation, but reflects the outgoing visible radiation, as shown.

In a modification of the arrangements shown in FIGS. 4 and 5, the LEDs 43 need not be aligned with apertures in the centres of pillars 6, but may be placed in any convenient location on subtrate 9 and (if necessary) aligned with apertures in the film 1.

The aforementioned embodiments have been illustrated by means of the electrode and pillar arrangements of FIG. 1. They are, however, equally applicable to other electrode and pillar arrangements, or indeed devices which do not use pillars to support the pyroelectric detector elements.

Instead of using LEDs such as 31 and 43, liquid crystal devices (LCDs) could be used; these devices having the advantage over LED's that local heat generation (which is a potential problem with LEDs) is eliminated.

Conveniently, the processing circuits 8 can be constructed and configured to perform both temporal and spatial processing prior to feeding the energising crystals to the LED or LCD visual display elements.

It will be appreciated that whilst the pyroelectric detector arrays described by way of example include a thin pyroelectric film of, for example, polyvinylidene fluoride, thermal imaging devices in accordance with the invention may incorporate alternate pyroelectric materials, such as machined ceramic pyroelectric slabs, which may be self supporting, or carried on a thermally insulative membrane.

I claim:

1. A thermal imaging device comprising an array of pyroelectric detector elements, means effective to transfer electrical signals between each detector element and a respective circuit means formed on a semiconducting substrate, and an array of display pixels, each display pixel being carried on a major surface of said substrate and connected to the output of a respective one of said circuit means.

2. A device according to claim 1 in which the display pixels comprise light emitting diodes.

3. A device according to claim 1 in which the display pixels comprise liquid crystal devices.

4. A device according to claim 1 in which the means for transferring electrical signals comprises an array of pillars which also supports the array of pyroelectric detector elements.

5. A device according to claim 4 in which each pillar is connected to a pyroelectric detector element by an elongate electrically conductive strip.

6. A device according to claim 1 in which the array of pyroelectric detector elements is disposed adjacent a first major surface of the substrate, and the display pixels are carried on the opposing major surface of the substrate.

7. A device according to claim 1 in which the array of pyroelectric detector elements are disposed adjacent the major surface of the substrate carrying the display pixels.

8. A device according to claim 7 in which the substrate includes at least regions which are infra-red transparent, incident infra-red radiation is arranged to be directed onto the opposing major surface of the substrate to the major surface carrying the display pixels.

9. A device according to claim 7 which a dichroic mirror is disposed between the source of incident infra-red radiation and the array of pyroelectric detector elements, the mirror being effective to direct incident infra-red radiation onto the array of pyroelectric detector elements, and to direct visible light from the array of display pixels towards a detector.

* * * * *